(12) United States Patent
Nobutoki et al.

(10) Patent No.: US 6,181,631 B1
(45) Date of Patent: Jan. 30, 2001

(54) SEMICONDUCTOR MEMORY DEVICE WITH A REDUCE ACCESS TIME BY DEVISING A LAYOUT OF A CIRCUIT WITHOUT ELABORATE MODIFICATION

(75) Inventors: Tomoko Nobutoki; Kouji Mine, both of Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/296,174

(22) Filed: Apr. 22, 1999

(30) Foreign Application Priority Data

Apr. 23, 1998 (JP) .................................. 10-113743

(51) Int. Cl.$^7$ ...................................................... G11C 8/00
(52) U.S. Cl. ...................... 365/230.03; 365/194; 365/63; 365/230.08
(58) Field of Search ............................... 365/230.03, 194, 365/230.08, 63

(56) References Cited

U.S. PATENT DOCUMENTS 5,369,619 * 11/1994 Ohba ................................ 365/230.03
5,699,289 * 12/1997 Talenaka ................................ 365/63
5,943,285 * 8/1999 Kohno ................................ 365/230.03

* cited by examiner

Primary Examiner—Richard Elms
Assistant Examiner—Tuan T. Nguyen
(74) Attorney, Agent, or Firm—Young & Thompson

(57) ABSTRACT

It is an object of the invention to provide a semiconductor memory device with a reduced access time by devising a layout of a circuit without elaborate modification. A Y address buffer is situated on the side of an address pad array (the right side), and outputs a signal for controlling Y address decoder situated on the right side and a circuit block communicated therewith. The Y address decoders on the right side control the Y addresses of memory cells in the memory cell arrays C and D in case that data are read therefrom or written thereinto. The circuit block communicated with the Y address buffer outputs a signal to the address decoders on the side of a DQ pad array (the left side) in accordance with the signal inputted from the Y address buffer. The Y address decoders on the left side control the Y addresses of the memory cells in the memory cell arrays A and B in accordance with the signal inputted from the circuit block communicated with the Y address buffer. Data amplifiers combined with the memory cell arrays A, B, C and d respectively amplify the data read from the memory cells in the memory cell arrays A, B, C and D. The circuit blocks situated on both the side ends of a semiconductor chip respectively output activation signals for activating the data amplifiers combined with the memory cell arrays A, B, C and D. The data amplifier-activation signals outputted from the circuit blocks on the left side end are respectively inputted to the delay circuits DL1 and DL2.

3 Claims, 8 Drawing Sheets

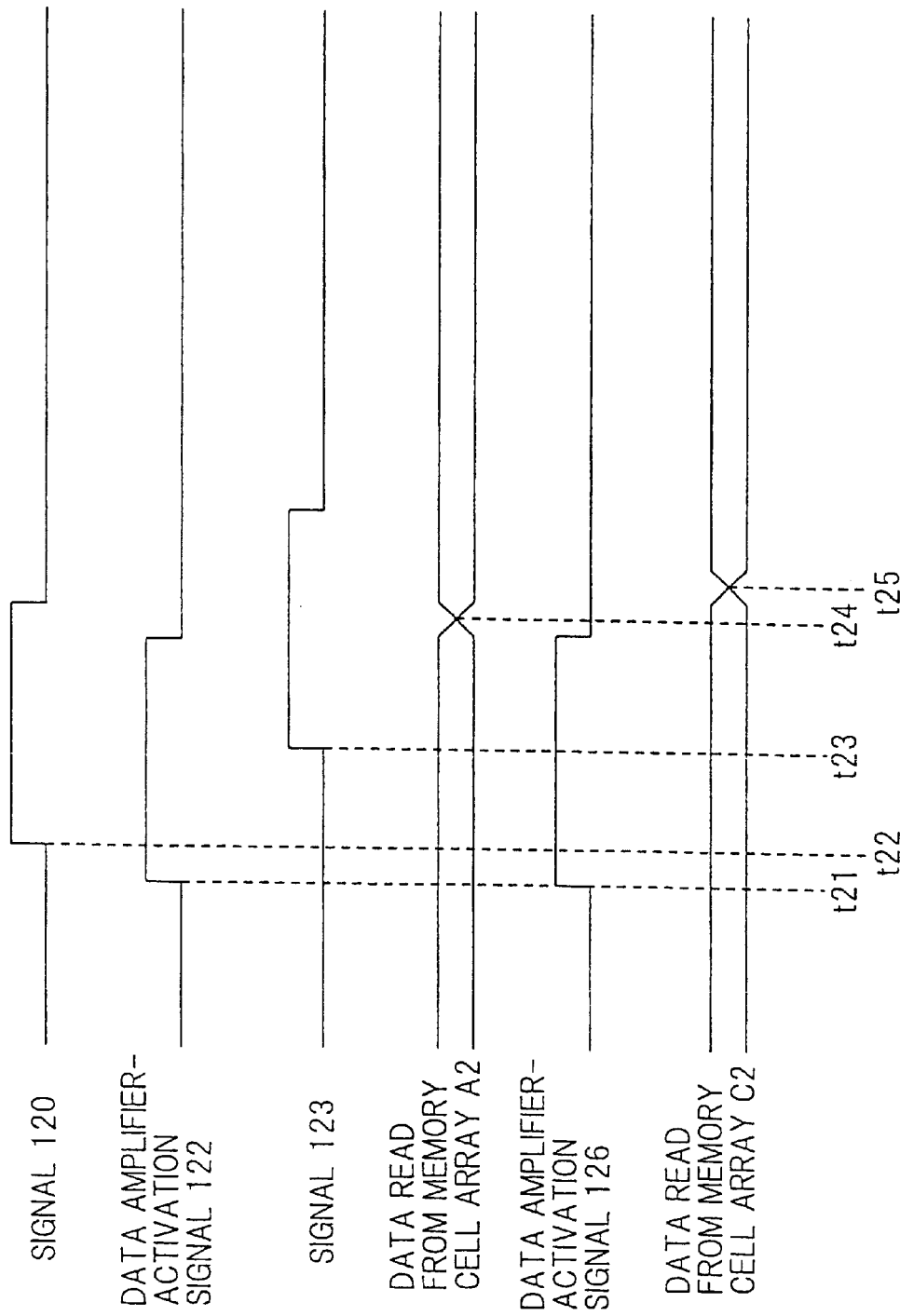

US 6,181,631 B1

SEMICONDUCTOR MEMORY DEVICE WITH A REDUCE ACCESS TIME BY DEVISING A LAYOUT OF A CIRCUIT WITHOUT ELABORATE MODIFICATION

FIELD OF THE INVENTION

The invention relates to a semiconductor memory device for storing data in a computer and etc.

BACKGROUND OF THE INVENTION

The outline of a typical structure of a conventional semiconductor memory device is that four memory cell arrays are formed near four corners of a rectangular shaped semiconductor chip and a Y address buffer for outputting address data is formed on a nearly central portion thereof. Each memory cell array is combined with a Y address decoder, which selects a memory cell in the memory cell array and reads data stored therein in accordance with the Y address data, and a data amplifier, which amplifies the data read by the Y address decoder and outputs it to an output circuit for supplying the amplified data to an external circuit. Since the output circuit is situated on a side end of the semiconductor chip, the length of a wiring between the output circuit and the memory cell array situated on the right side of the semiconductor chip is inevitably different from that between the output circuit and the memory cell array situated on the left side. Accordingly, there arises a difference in a delay time of the data between those started from the memory cell arrays situated on the right and left sides of the semiconductor chip. In other words, an access time to the memory cell array on the right side is different from that to the same on the left side, and it is extremely desirable to remove this disadvantage.

SUMMARY OF THE INVENTION

The invention is made on the basis of the aforementioned background, and it is an object of the invention to provide a semiconductor memory device having a reduced access time by devising the layout of the circuit without elaborate modification.

According to the feature of the invention, and semiconductor device comprises:

plural memory cell arrays, an address buffers for outputting address data, address decoders, which are respectively combined with the plural memory cell arrays, select memory cells in the memory cell array in accordance with the address data and read data stored therein, amplifiers, which respectively amplify the data and output amplified results as output data, activation circuits, which respectively output activation signals for activating the amplifiers, and an output circuit for outputting the output data to an external circuit, wherein the plural memory cell arrays, the address buffer, the address decoders, the amplifiers, the activation circuits and the output circuit are respectively formed on a same semiconductor chip; and a length of a wiring between the address decoder combined with the memory cell array remote from the output circuit and the address buffer is shorter than that between the address decoder combined with the memory cell array near the output circuit and the address buffer.

BRIEF DESCRIPTION OF THE DRAWINGS

The invention will be explained in more detail in conjunction with appended drawings, wherein:

FIG. 8 is a timing chart for explaining an operation of a semiconductor memory device according to the third preferred embodiment of the invention.

DESCRIPTION OF THE PREFERRED

Before explaining a semiconductor memory device in the preferred embodiments according to the invention, the aforementioned conventional semiconductor memory device will be explained referring to FIGS. 1 to 2.

Figure 1:
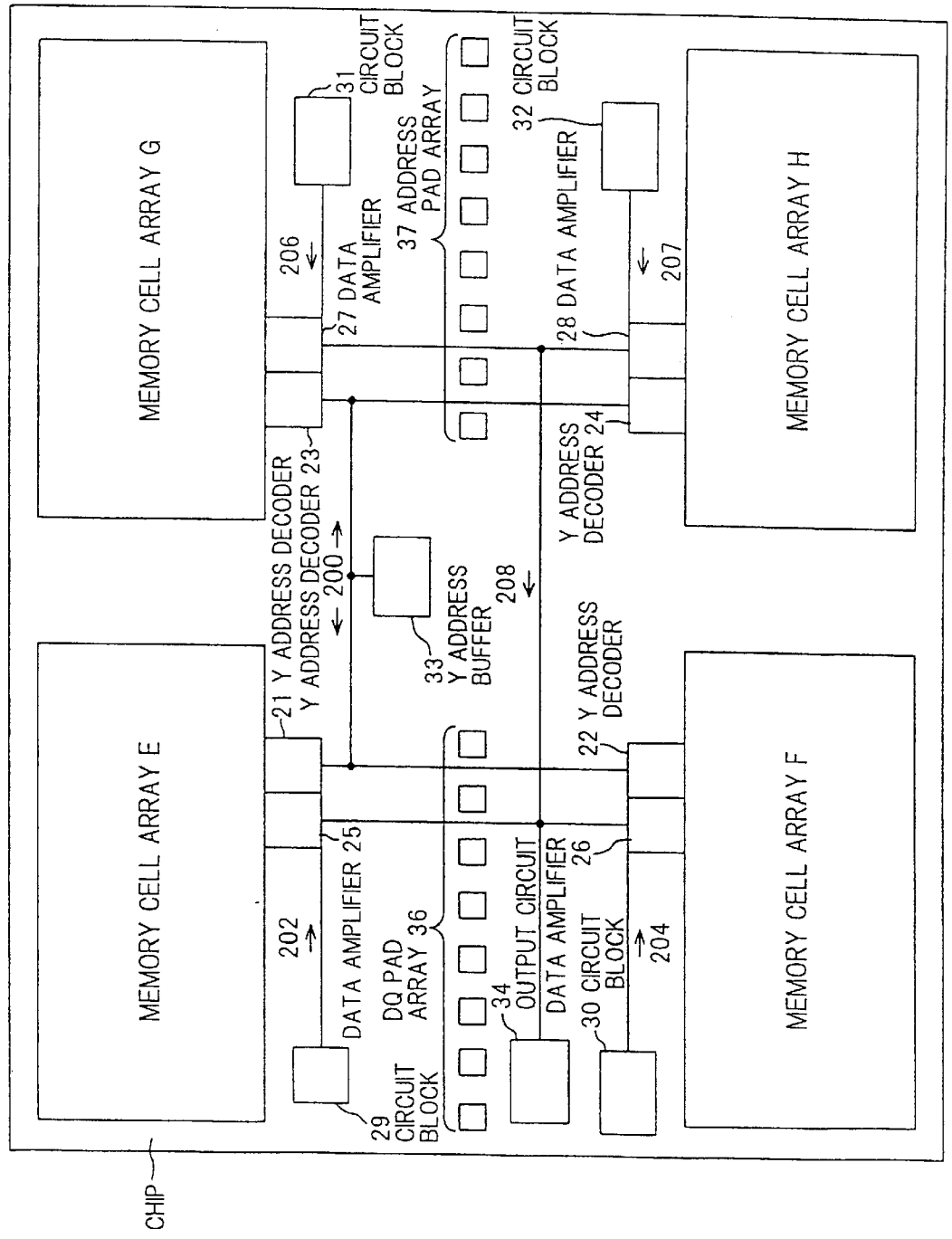
FIG. 1 is a block diagram for showing a structure of a conventional semiconductor memory device.
Figure 2:
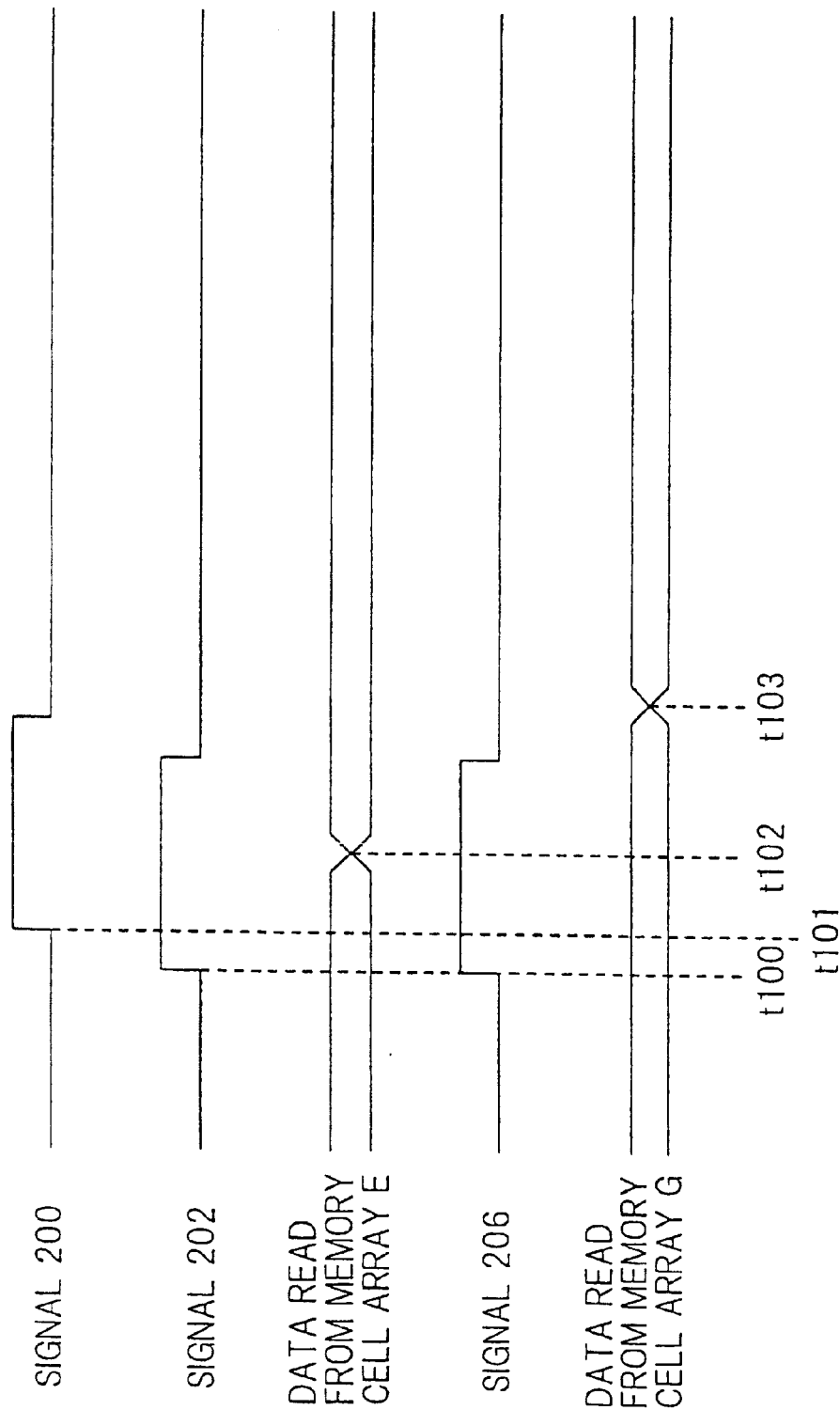
FIG. 2 is a timing chart for explaining an operation of a conventional semiconductor memory device.

FIG. 1 shows the layout of circuit blocks in the conventional semiconductor memory device.

As shown in the drawing, pad arrays are situated along center lines of the semiconductor memory device. That is to say, a data terminal (DQ, hereinafter) pad array 36 is situated on the left side of the semiconductor memory device, and an address pad array 37 on the right side.

Memory cell arrays, E,F,G and H are situated on both the sides of the PQ pad array 36 and the address pad array 37. A Y address buffer 33 is situated on a nearly central portion of a chip. A signal 200 outputted from the address buffer 33 is inputted to Y address decoders 23 and 24 for controlling Y addresses of memory cells in the memory cell arrays G and H, both being on the side of the address array, in case that data are read therefrom or written thereinto, and Y address decoders 21 and 22 for controlling Y addresses of memory cells in the memory cell arrays E and F, both being on the side of the DQ pad array, in case that data are read therefrom or written thereinto.

Moreover, on the chip, there are data amplifiers 25, 26, 27 and 28 for amplifying data read from the memory cell arrays E, F, G and H and circuit blocks 29, 30, 31 and 32 for generating signals, which respectively activate the data amplifiers 25, 26, 27 and 28. A data amplifier-activation signal 202 generated by the circuit block 29 is inputted to the data amplifier 25. A data amplifier-activation signal 204 generated by the circuit block 30 is inputted to the data amplifier 26.

A data amplifier-activation signal 206 generated by the circuit block 31 is inputted to the data amplifier 27. A data amplifier-activation signal 207 generated by the circuit block 32 is inputted to the data amplifier 28. Signals generated by the data amplifiers 25, 26, 27 and 28 pass through a read-write bus, and are outputted to DQ pins via the output circuit 34.

Next, the operation of the conventional semiconductor memory device will be explained referring to FIG. 2. FIG.

2 is a timing chart for explaining reads of data from the memory cells in the memory cell arrays E and G. A signal 200 outputted from the Y address buffer 33 at a time t101 is inputted to the Y address decoder 23 on the side of the address pad array and the Y address decoder 21 on the side of the DQ pad array. Since the Y address buffer 33 is situated on the nearly central portion of the chip, the signal 200 is inputted to the Y address decoders 21 and 23 at almost the same time, though the signal 200 is delayed by resistances and capacitance of the wiring.

The Y address decoders 21 and 23 respectively decode the signal 200, activate Y switches built in themselves by the decoded signals, read data stored in the memory cells in the memory cell arrays E and G, and output them to the data amplifiers 25 and 27. Since the circuit blocks 29 and 31, both generating the data amplifier-activation signals, are activated at almost the same time, the data amplifiers 25 and 27 are respectively activated at a time t100, amplify the data read from the memory cells in the memory cell arrays E and G, and output them to the read-write bus. The output circuit 34 outputs the data read from the memory cells in the memory cell arrays E and G to the DQ pins.

However, in the aforementioned conventional semiconductor memory device, since the length of the wiring between the data amplifier 27 and the output circuit 34 is longer than that between the data amplifier 25 and the output circuit 34, the data read from the memory cell in the memory cell array G arrive at the output circuit 34 later than the data read from the memory cell in the memory cell array E on account of the delay of the data in the wiring, which is caused by a resistance and a capacitance of the wiring, and there arises a undesirable influence on the access time of the chip. As shown in FIG. 2, the data read from the memory cell array E are outputted to the DQ pins at the time t102 and the data read from the memory cell array G at the time t103.

Figure 3:
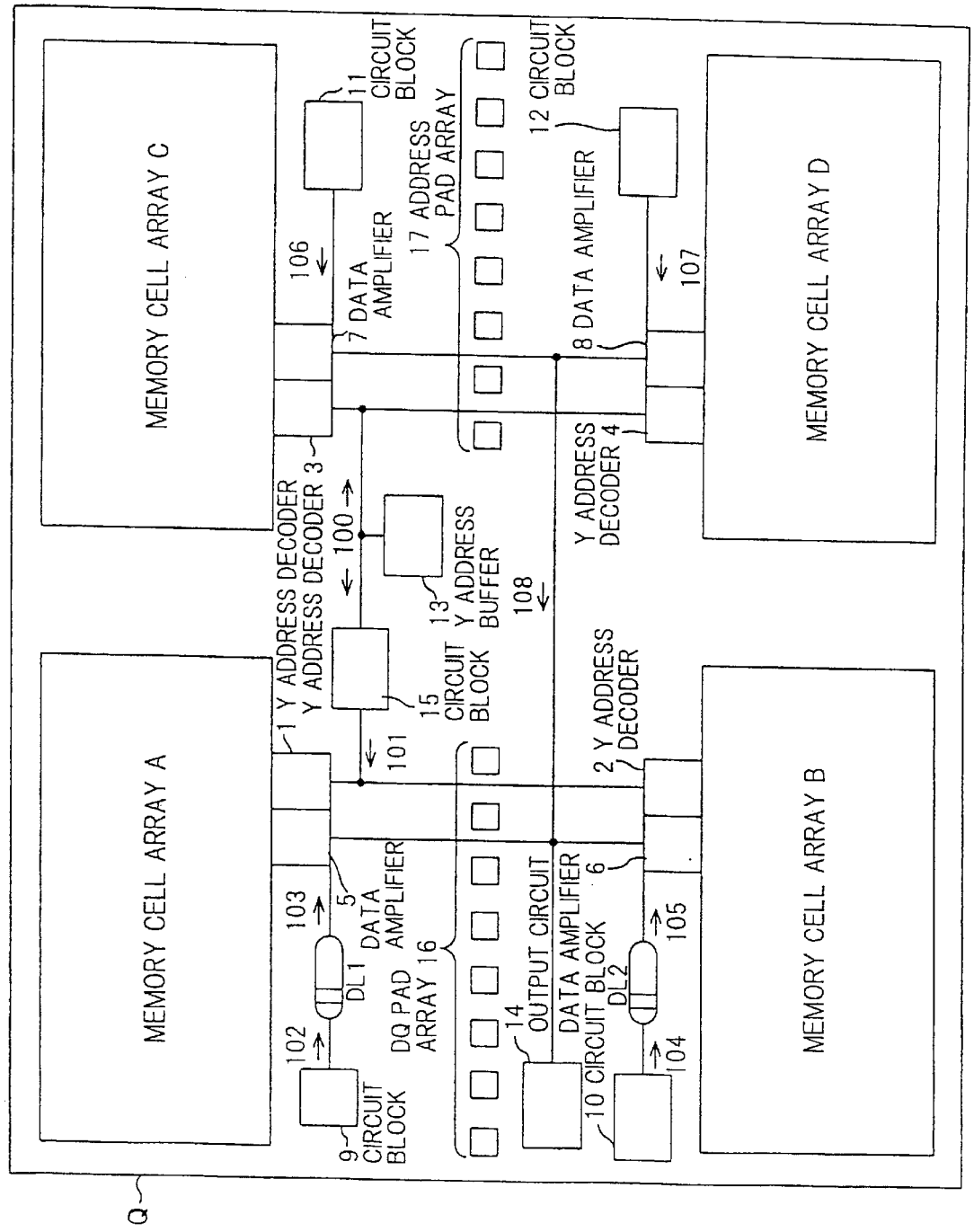
FIG. 3 is a block diagram for showing a structure of a semiconductor memory device according to the first preferred embodiment of the invention.

Thereafter, the preferred embodiments of the invention will be explained referring to the appended drawings. FIG. 3 is a block diagram for showing the structure of a semiconductor memory device according to the first preferred embodiment of the invention. As shown in the drawing, a DQ pad array 16 is situated on the left side of a chip Q, and an address pad array 17 is situated on the right side of the same. Memory cell arrays A, B, C and D are respectively situated on the both sides of the DQ pad array 16 and the address pad array 17.

A Y address buffer 13 is situated on the side of the address pad array 17, and outputs a signal 100 for controlling Y address decoders 3 and 4 and a circuit block 15. The Y address decoders 3 and 4 respectively control Y addresses of memory cells in the memory cell arrays C and D situated on the side of the address pad array 17 in cases that data are read therefrom or written thereinto. The circuit block 15 outputs a signal 101 to Y address decoders 1 and 2 in accordance with the signal 100.

The Y address decoders 1 and 2 respectively control Y addresses of the memory cell arrays A and B on the side of the DQ pad array 16 on the basis of the signal 101 in case that data are read therefrom or written thereinto. Data amplifiers 5, 6, 7 and 8 respectively amplify the data read from the memory cell arrays A, B, C and D. Circuit locks 9, 10, 11 and 12 respectively generate data amplifier-activation signals 102, 104, 106 and 107.

The data amplifier-activation signal 102 generated by the circuit block 9 is inputted to a delay circuit DL1, and a signal 103 outputted from the delay circuit DL1 is inputted to the data amplifier 5. The data amplifier-activation signal 104 generated by the circuit block 10 is inputted to a delay circuit DL2, and a signal 105 outputted from the delay circuit DL2, is inputted to the data amplifier 6. The data amplifier-activation signal 106 generated by the circuit block 11 is inputted to the data amplifier 7. The data-activation signal 107 generated by the circuit block 12 is inputted to the data amplifier 8. Signals amplified by the data amplifier 5, 6, 7 and 8 are expressed as a read-write bus signal 108 and outputted to DQ pins (a DQ pad array) via the output circuit 14.

Figure 4:
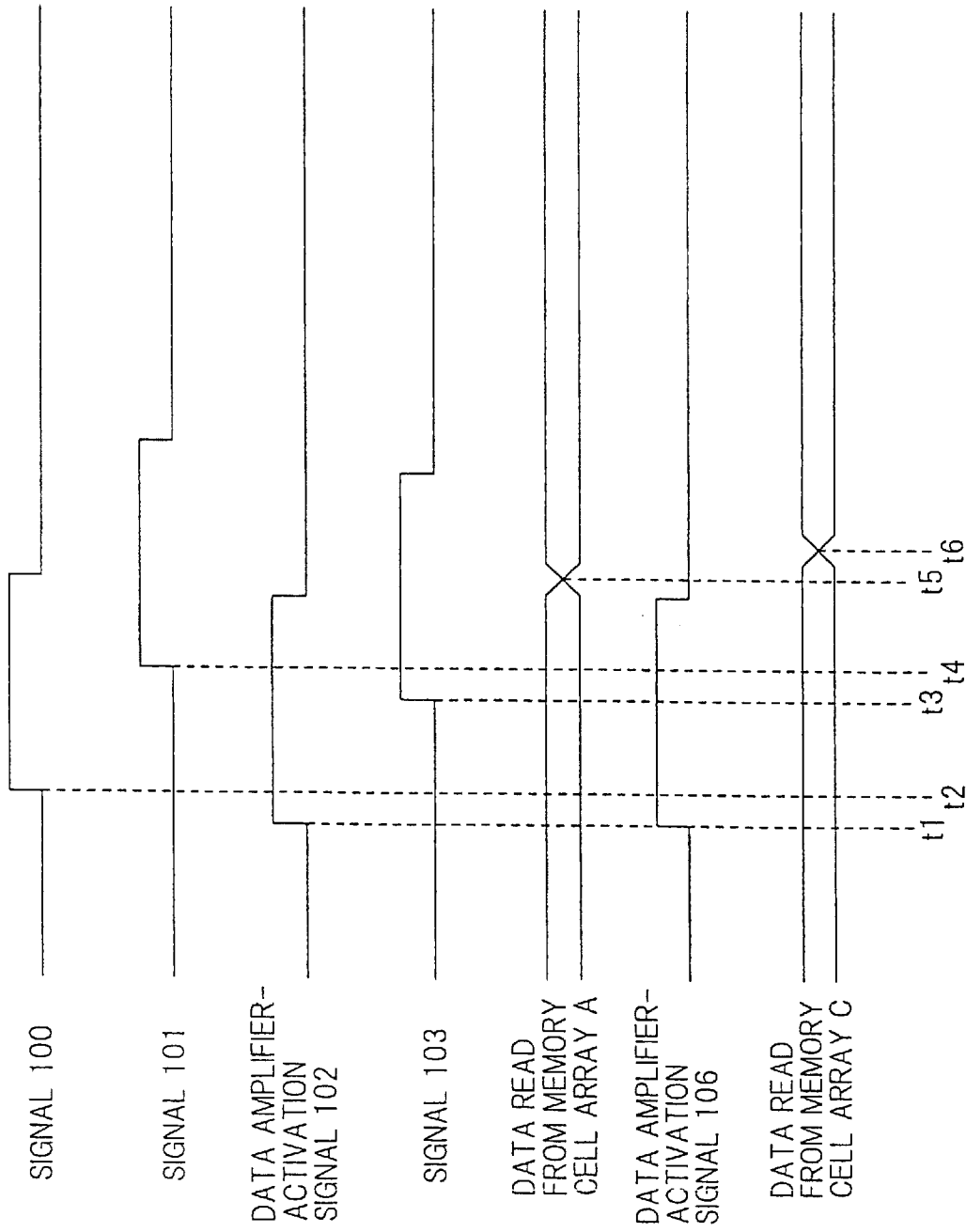
FIG. 4 is a timing chart for explaining an operation of a semiconductor memory device according to the first preferred embodiment of the invention.

Next, the operation of the first preferred embodiment will be explained referring to FIGS. 3 and 4. FIG. 4 is a timing chart for explaining a case that data are read from memory cells in the memory cell array A and C. First, read of the data stored in the memory cell in the memory cell array C will be explained.

At a time t1, the circuit blocks 9 and 11 respectively generate the data amplifier-activation signals 102 and 106.

At a time t2, the Y address buffer 13 outputs the signal 100 to the Y address decoder 3. Since the Y address buffer 13 is situated on the side of the address pad array 17 and the length of a wiring between the Y address buffer 13 and the Y address decoder 3 is short, the effect of the resistance and the capacitance of the wiring on the signal 100 is not so large.

The Y address decoder 3 decodes the input signal 100, activates a Y switch built in itself by the decoded signal, and reads the data from the memory cell in the memory cell array C. Then, the Y address decoder 3 outputs the read data to the data amplifier 7. At this time, the data amplifier 7 is activated by the data amplifier activation signal 106, amplifies the data read from the memory cell in the memory cell array C, and outputs the amplified data as a read-write bus signal 108. Thereby, at a time t6, the output circuit 14 outputs the data read from the memory cell in the memory cell array C to the DQ pins.

Next, read of data from a memory cell in the memory cell array A will be explained.

At a time t2, the Y address buffer 13 outputs the signal 100 to a circuit block 15. At a time t4, the circuit block 15 buffs the input signal and outputs it to the Y address decoder 1 as a signal 101. The Y address decoder 1 activates a Y switch built in itself by the input signal 101, and reads data from a memory cell in the memory cell array A.

The Y address decoder 1 outputs the data read from the memory cell in the memory cell array A to the data amplifier 5. The data amplifier-activation signal 102 outputted from the circuit block 9 at the time t1 is inputted to the delay circuit D1. The delay circuit DL1 delays the inputted data amplifier-activation signal 102 and outputs a signal 103 at a time t3.

Accordingly, the signal 103 activates the data amplifier 5 simultaneously with data-reading from the memory cell in the memory cell array A. Then, the data amplifier 5 amplifies the data read from the memory cell in the memory cell array A and outputs it to the output circuit 14 as the read-write bus signal 108. Thereby, at a time t5, the output circuit 14 outputs the data read from the memory cell in the memory cell array A to the DQ pins. As shown in FIG. 4, t5 is nearly equal to t6.

A wiring length between the output the terminal of the data amplifier 5 and the input terminal of the output circuit 14 is naturally determined by the situations of the memory cell array A and the pads. Accordingly, the wiring length between the data amplifier 5 and the output circuit 14 is inevitably different from that between the data amplifier 7 and the output circuit 14. As the result, a difference in the delay time of the data between those started from the data amplifiers 5 and 7 arises at the output circuit 14.

In the invention, regarding read of data in the memory cell array C, the Y address buffer 13 is set on the side of the address pad array 17, in other words the memory cell array C, so that a Y switch build in the Y address decoder 3 is activated as early as possible and the data in the side of the address pad array 17 is read earlier than that in the memory cell array A.

On the other hand, in case that the data in the memory cell array A is read, although the signal is delayed on account of a resistance and a capacitance of the wiring on the way from the Y address buffer 13 to the address decoder 1, since the signal is buffed and reshaped in the circuit block 15 and the length of the read-write bus between the data amplifier 5 and the output circuit 14 is short, there arises no undesirable influence on an access time of a chip. Though the explanations are not given in the above, the similar effects can be obtained in case that the data are read form the memory cell arrays B and D also.

As mentioned in the above, accordance to the invention, by setting the Y address buffer 13 on the side of the address pad array 17, the data stored in the memory cell array C on the side of the address pad array 17 can be read earlier than the data in the same in the conventional semiconductor memory device; and by shifting the time of activation of the data amplifier 5, the data read from the memory cell arrays A and C can be outputted to the output circuit 14 nearly at the same time.

Although an embodiment of the invention has been explained in detail referring to the appended drawings in the above, the concrete structure is never restricted to the aforementioned embodiment, and a modified structure within the real substance of the invention is included in the invention.

Figure 5:
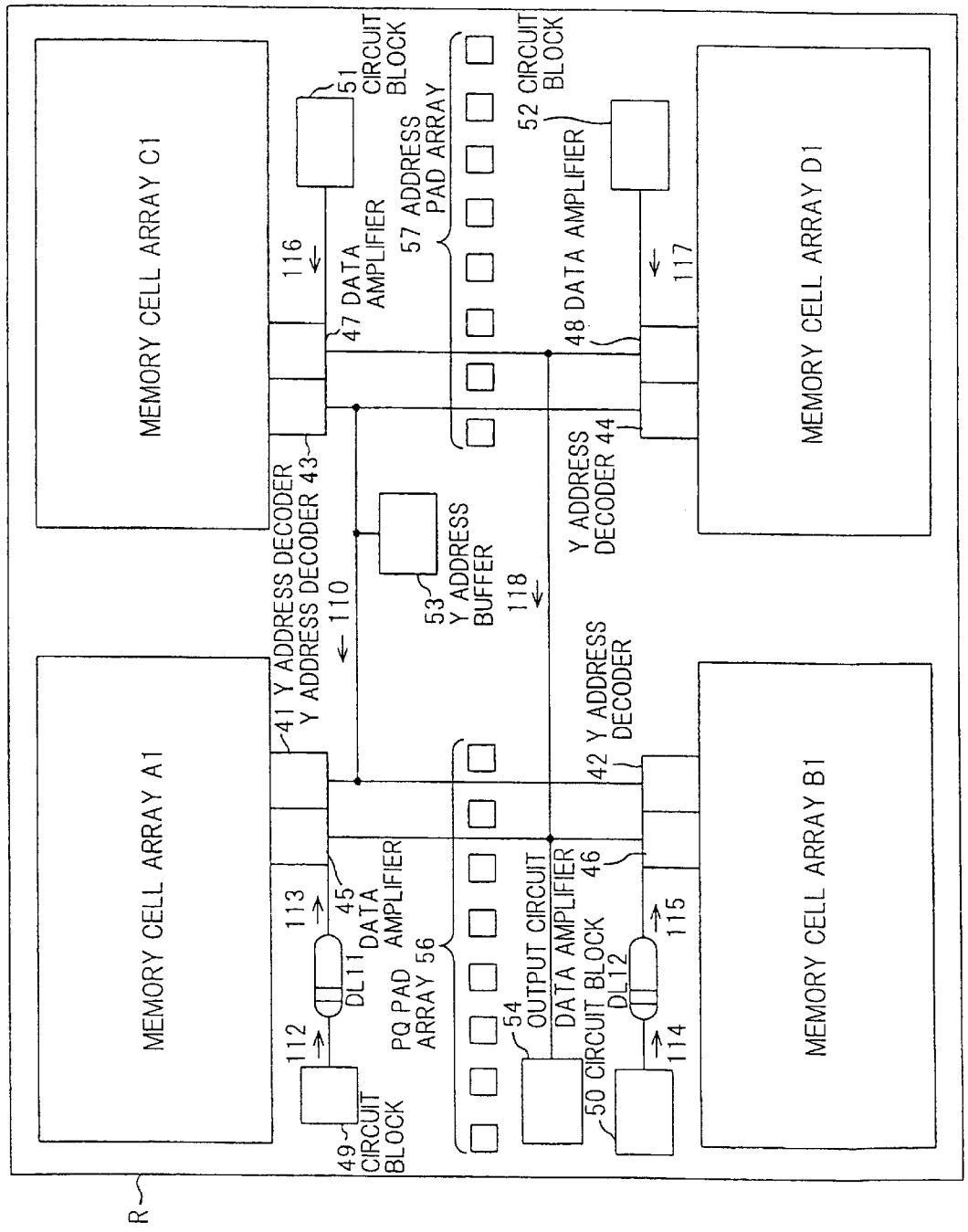
FIG. 5 is a block diagram for showing a structure of a semiconductor memory device according to the second preferred embodiment of the invention.

For instance, a chip R of the semiconductor memory device having a structure shown in FIG. 5 will be explained as the second preferred embodiment of the invention.

In this drawing, a DQ pad array 56 is situated on the left side of the chip, and an address pad array 57 on the right side. Memory cells A1, B1, C1, and D1 are respectively situated on both the sides of the DQ pad array 56 and the address pad array 57. A Y address buffer 53 is situated on the side of the address pad array 57, and outputs a signal 110 to Y address decoders 43 and 44 and Y address decoders 41 and 42.

The Y address decoders 43 and 44 respectively control Y addresses of memory cells in the memory cell array C1 and D1 situated on the side of the address pad array 57 in accordance with the input signal 110 in case that the data are read therefrom or written thereinto. Moreover, Y address decoders 41 and 42 respectively control Y addresses of the memory cells in the memory cell arrays A and B1 situated on the side of the DQ pad array 56 in accordance with the signal 110 in case that the data are read therefrom or written thereinto.

Data amplifiers 45, 46, 47 and 48 respectively amplify data read from the corresponding memory cell arrays A, B1, C1 and D1. A circuit block 49 outputs a data amplifier-activation signal 112 for activating the data amplifier 45 to a delay circuit DL11. A circuit clock 50 outputs a data amplifier-activation signal 114 for activating the data amplifier 46 to a delay circuit 12.

A circuit block 51 outputs a data amplifier-activation signal 116 for activating the data amplifier 47 to the data amplifier 47. A circuit block 52 outputs a data amplifier-activation signal 117 for activating the data amplifier 48 to the data amplifier 48. The delay circuit DL11 delays the inputted data amplifier-activation signal 112, and outputs it to the data amplifier 45 as a signal 113. The delay circuit DL 12 delays the inputted data amplifier-activation signal 114, and outputs it to the data amplifier 46 as a signal 115. An output circuit 54 outputs signals amplified by the data amplifiers 45, 46, 47 and 48 to DQ pins.

Figure 6:
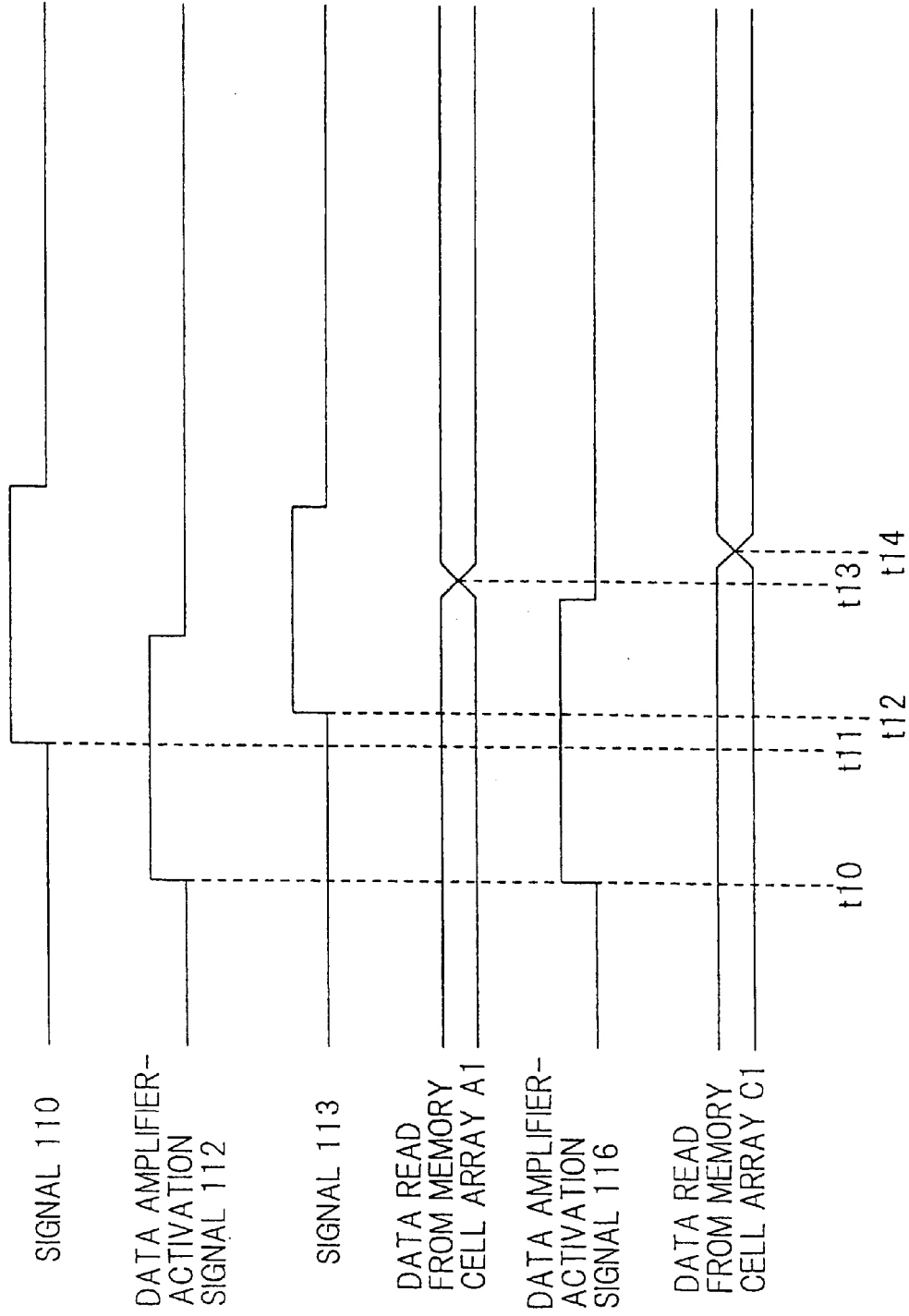
FIG. 6 is a timing chart for explaining an operation of a semiconductor memory device according to the second preferred embodiment of the invention.

The operation of the semiconductor memory device according to the second preferred embodiment of the invention will be explained referring to FIGS. 5 and 6. FIG. 6 is a timing chart for explaining read of data from memory cells in the memory cell arrays A1 and C1. First, read of data from a memory cell in the memory cell array C1 will be explained.

At a time t10, the circuit blocks 49 and 51 respectively outputs the data amplifier activation signals 112 and 116.

At a time t11, the Y address buffer 53 outputs a signal 110 to a Y address decoder 43. Since the Y address buffer 53 is situated on the side of the address pad array 57, the length of a wiring between the Y address buffer 53 and the Y address decoder 43 is short. Accordingly, an effect of a resistance and a capacitance of the wiring on the signal 110 is not so large.

The Y address decoder 43 decodes the inputted signal 110 and activates a Y switch built in itself by the decoded signal. Thereby, the Y address decoder 43 reads data stored in a memory cell in the memory cell array C1 and outputs the read data to the data amplifier 47. The data amplifier 47 is activated by the data amplifier-activation signal 116 outputted at the time t10.

Thereby, the data amplifier 47 amplifies the data read from the memory cell in the memory cell array C1 and outputs it to the output circuit 54 as the read-write bus signal 118. As the result, at a time t14, the output circuit 54 outputs the data read from the memory cell in the memory cell array C1 to DQ pins.

Next, read of data from a memory cell in the memory cell array A1 will be explained.

At the time t11, the Y address buffer 53 outputs the signal 110 to the Y address decoder 41. Thereby, the address decoder 41 decodes the inputted signal 110, and activates a Y switch built in itself by the decoded signal. The, the Y address decoder 41 reads data stored in a memory cell in the memory cell array A1, and outputs the read data to a data amplifier 45.

At the time t10, a circuit block 49 outputs a data amplifier-activation signal 112 to a delay circuit DL11, the delay circuit DL11 delays the inputted data amplifier-activation signal 112, and, at a time t12, outputs it as a signal 113 simultaneously with data-reading from the memory cell in the memory cell array A1.

The data amplifier 45 is activated by the signal 113 inputted thereto, amplifies the data read from the memory cell in the memory cell array A1 and outputs the amplified data to the output circuit 54. As the result, at the time t13, the output circuit 54 outputs the data read from the memory cell in the memory cell array A1 to the DQ pins. As shown in FIG. 6, t13 is nearly the same as t14.

The wiring length between the data amplifier 45 and the output circuit 54 is inevitably different from that between the data amplifier 47 and the output circuit 54. Accordingly, a difference in the delay time of the data between those started from the data amplifiers 45 and 47 arises at the output circuit 54. In this invention, the Y address buffer 53 is set on the side of the address pad array 57, in other words the memory cell array C1, so that the Y switch built in the Y address decoder 43 is activated as early as possible and the data on the side of the address pad array 57 is read earlier than the data on the same in the conventional semiconductor memory cell array.

On the other hand, in case that the data in the memory cell in the memory cell array A1 is read, although the signal is delayed on account of a resistance and a capacitance of the wiring on the way from the Y address buffer 53 to the Y address decoder 41, since the length of the read-write bus between the data amplifier 45 and the output circuit 54 is short, there arises no undesirable influence on the access time of the chip. Though the explanations are not given in the above, the similar effects can be obtained in case that the data are read from the memory cell arrays B1 and D1 also.

Figure 7:
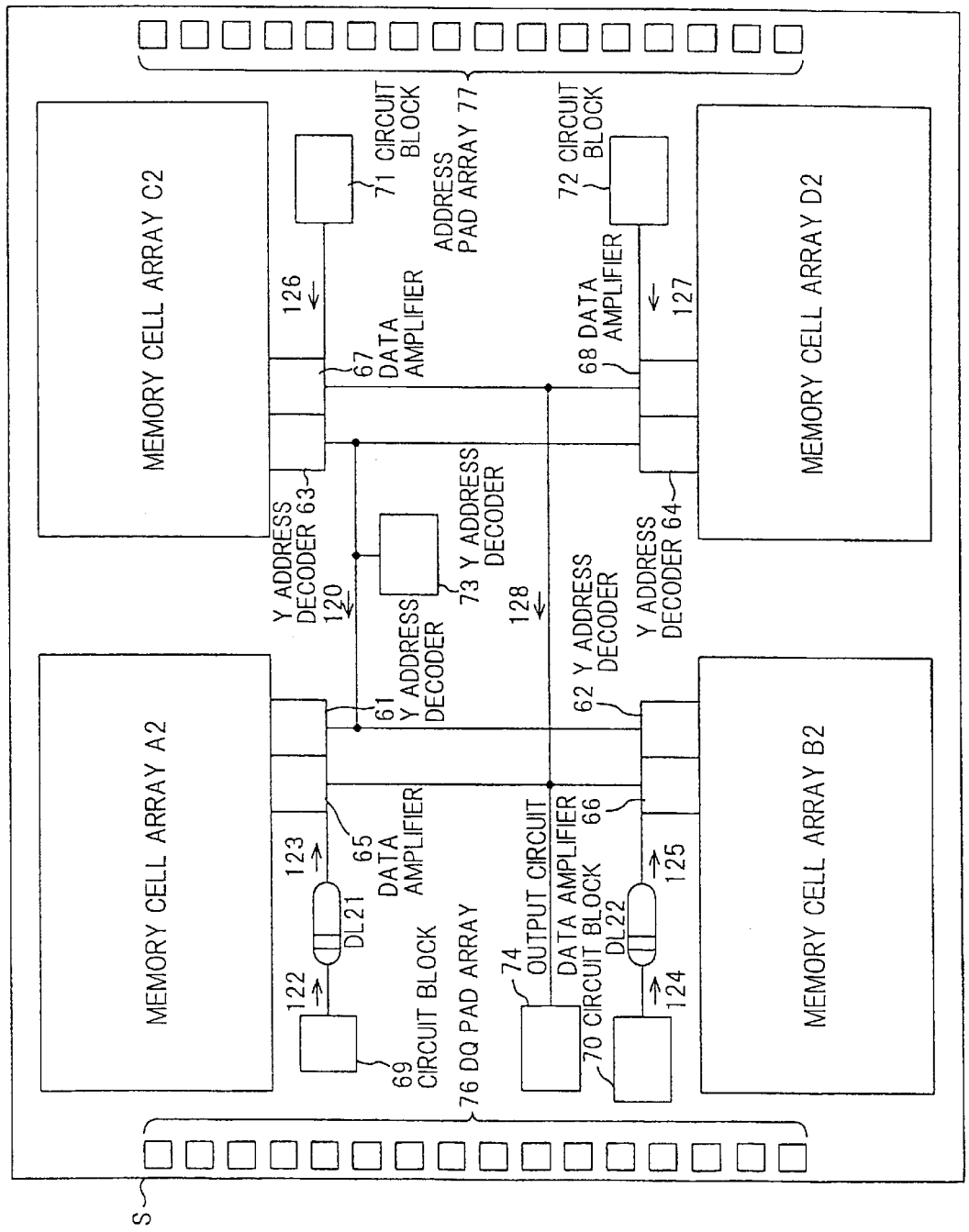
FIG. 7 is a block diagram for showing a structure of the third preferred embodiment of the invention.

Next, a semiconductor memory device on the chip S shown in FIG. 7 will be explained as the third preferred embodiment of the invention. FIG. 7 is a block diagram for showing the structure of the semiconductor memory device according to the third preferred embodiment. A DQ pad array 76 is situated on the left side end of the chip S, and an address pad array 77 is situated on the right side end of the chip S. Memory cell arrays A2, B2, C2, and D2 are situated between the DQ pad array 76 and the address pad array 77.

A Y address buffer 73 is situated on the side of the address pad array 77, and outputs a signal 120 to the Y address decoders 63 and 64. The Y address decoders 63 and 64 respectively control the Y addresses of the memory cells in the memory cell arrays C2 and D2 on the side of the address pad array 77 by the inputted signal 120 for in case that the data are read therefrom or written thereinto. Similarly, the Y address buffer 73 outputs the signal 120 to the Y address decoders 61 and 62. The Y address decoder 61 and 62 respectively control Y addresses of the memory cells in the memory cell arrays A2 and B2 on the side of the DQ pad array by the inputted signal 120 in case that the data are read therefrom or written thereinto.

The data amplifiers 65, 66, 67 and 68 respectively amplify the data read from the memory cell array A2, B2, C2, and D2. A circuit block 69 outputs a data amplifier-activation signal 122 for activating a data amplifier 65 to a delay circuit DL21. A circuit block 70 outputs a data amplifier-activation signal 124 for activating a data amplifier 66 to a delay circuit DL 22.

A circuit block 71 outputs a data amplifier-activation signal 126 for activating a data amplifier 67 to the data amplifier 67. A circuit block 72 outputs a data amplifier-activation signal 127 for activating a data amplifier 68 to the data amplifier 68. The delay circuit DL 21 delays the inputted data amplifier-activation signal 122 and outputs it to the data amplifier 65 as a signal 123.

The delay circuit DL22 delays the inputted data amplifier-activation signal 124 and outputs it to the data amplifier 66 as a signal 125. An output circuit 74 outputs the data respectively amplified by the data amplifiers 65, 66, 67 and 68 to DQ pins.

Next, the operation of the semiconductor memory device according to the third preferred embodiment will be explained referring to FIGS. 7 and 8. FIG. 8 is a timing chart for case that the data are read from the memory cells in the memory cell arrays A2 and c2. First, read of the data from the memory cell in the memory cell array C2 will be explained.

At a time t21, the circuit block 69 outputs the data amplifier-activation signal 122 to the delay circuit DL 21. At the same time, the circuit block 71 outputs the data amplifier-activation signal 126 to the Y address decoder 67.

At a time t22, the Y address buffer 73 outputs a signal 120 to the Y address decoder 63. Since the Y address buffer 73 is situated on the side of the address pad array 77, the length of wiring between the Y address buffer 73 and the Y address decoder 63 is short. Accordingly, the effect of a resistance and a capacitance of the wiring on the signal 120 is not so large.

The Y address decoder 63 decodes the inputted signal 120 and activates a Y switch built in itself by the decoded signal. Thereby, the Y address decoder 63 reads the data stored in the memory cell in the memory cell array C2 and outputs the read data to the data amplifier 67. The data amplifier 67 is activated by the data amplifier-activation signal 126, which is outputted from the circuit block 71 at a time t21.

Thereby, the data amplifier 67 amplifies the data read from the memory cell in the memory cell array C2, and outputs it to the output circuit 74 as a read-write bus signal 128. As the result, the output circuit 74 outputs the data read from the memory cell in the memory cell array C2 to DQ pins at a time t25.

Next, read of data from a memory cell in the memory cell array A2 will be explained. At the time t22, the Y address buffer 73 outputs the signal 120 to the Y address decoder 61. The Y address decoder 61 decodes the inputted signal 120, and activates a Y switch built in itself by the decoded signal. Thereby, the Y address decoder 61 reads data from a memory cell in the memory cell array A2, and outputs the read data to the data amplifier 65.

Moreover, at the time t21, the circuit block 69 outputs a data amplifier-activation signal 122 to a delay circuit DL 21. The delay circuit DL 21 delays the inputted signal 122, and, at a time t23, outputs it to the data amplifier 65 as a signal 123 simultaneously with data-reading from the memory cell in the memory cell array A2.

The data amplifier 65 is activated by the inputted signal 123, amplifies the data read from the memory cell in the memory cell array A2, and outputs it to the output circuit 74 as a read write bus signal 128. As the result, at the time t24, the output circuit 74 outputs the data read from the memory cell in the memory cell array A2 to the DQ pins. As shown in FIG. 8, t24 is nearly the same as t25.

The length of a wiring between the data amplifier 65 and the output circuit 74 is inevitably different from that between the data amplifier 67 an the output circuit 74. Accordingly, there arises a difference in the delay time of the data between those started from the data amplifiers 65 and 67 at the output circuit 74. In this embodiment of the invention, the Y address buffer 73 is situated on the side of the address pad array 77, in other words the memory cell array C2, so that the Y switch built in the Y address decoder 63 is activated as early as possible and the data on the side of the address pad array is read earlier than the data on the same in the conventional semiconductor memory device.

On the other hand, in case that the data in the memory cell in the memory cell array A2 is read, although the signal is delayed on account of a resistance and capacitance of the wiring on the way from the address buffer 73 to the Y address decoder 61, since the length of the wiring of the read-write bus between the data amplifier 65 and the output circuit 74 is short, there arises no undesirable influence on the access time of a chip. Though the explanation is not in the above, similar effects can be obtained in case that data are read from the memory cell arrays B2 and D2.

Although the explanations have been given on the Y address signal throughout the first to third preferred embodiments, the invention can be applied to the signal of the other kind.

According to the invention described in claim 1, since an address buffer for outputting address data, address decoders which select memory cells in memory cell arrays and read data stored therein, amplifiers which amplify the data and output amplified results as output data, activation circuits which output activation signals for activating the amplifiers and an output circuit for outputting the output data to the external circuits are respectively formed on a surface of a semiconductor chip and a length of a wiring between the address buffer and the address decoder combined with a memory cell situated remote from the output circuit is shorter than that between the address buffer and the other address decoder combined with the other memory cell array situated near the output circuit, an access time for data-reading from the memory cell situated remote from the output circuit can be reduced.

According to the invention described in claim 2, since a delay circuit for delaying the activation signal is inserted between the amplifier for amplifying the data outputted from the address decoder combined with the memory cell array situated near the output circuit and the activation circuit for activating the aforementioned amplifier, the access times to the memory cell array situated near by and remote from the output circuit can be made to agree with each other.

According to the invention described in claim 3, since a buffer is inserted between the address buffer and the address decoder combined with the memory cell array situated near by the output circuit, the transmission time of the address data be reduced, even in case that the length of a wiring between the address buffer and the aforementioned address decoder is long and a capacitance and a resistance of the wiring increase.

What is claimed is:

1. A semiconductor memory device comprising:

plural memory cell arrays, an address buffers for outputting address data, address decoders, which are respectively combined with said plural memory cell arrays, select memory cells in said memory cell array in accordance with said address data and read data stored therein, amplifiers, which respectively amplify said data and output amplified results as output data, activation circuits, which respectively output activation signals for activating said amplifiers, and an output circuit for outputting said output data to an external circuit, wherein said plural memory cell arrays, said address buffer, said address decoders, said amplifiers, said activation circuits and said output circuit are respectively formed on a same semiconductor chip; and a length of a wiring between said address decoder combined with said memory cell array remote from said output circuit and said address buffer is shorter than that between said address decoder combined with said memory cell array near said output circuit and said address buffer.

2. A semiconductor memory device according to claim 1, wherein:

delay circuits for delaying said activation signals are respectively inserted between said amplifiers and said activation circuits.

3. A semiconductor memory device according to claim 2, wherein:

buffers for reshaping waveforms of signals representing said address data are respectively inserted between said address buffer and said address decoders combined with said memory cell arrays near said output circuit.

* * * * *